United States Patent [19]

Dinkel et al.

[11] Patent Number: 4,691,320

[45] Date of Patent: Sep. 1, 1987

[54] SEMICONDUCTOR STRUCTURE AND DEVICES

[75] Inventors: Nancy A. Dinkel, Spotswood; Bernard Goldstein, Princeton; Michael Ettenberg, Freehold, all of N.J.

[73] Assignee: RCA Corporation, Princeton, N.J.

[21] Appl. No.: 710,274

[22] Filed: Mar. 11, 1985

[51] Int. Cl.$^4$ .............................................. H01S 3/19
[52] U.S. Cl. ...................................... 372/45; 357/16; 357/17; 372/48
[58] Field of Search ............... 372/46, 45, 48; 357/16, 357/17

[56] References Cited

U.S. PATENT DOCUMENTS

| 3,753,801 | 8/1973 | Lockwood et al. | 148/171 |
|---|---|---|---|
| 3,982,207 | 9/1976 | Dingle et al. | 372/46 |
| 4,257,011 | 3/1981 | Nakamura et al. | 372/46 |
| 4,280,106 | 7/1981 | Scifres et al. | 372/48 |
| 4,317,085 | 2/1982 | Burnham et al. | 372/50 |
| 4,326,176 | 4/1982 | Aiki et al. | 372/45 |
| 4,416,011 | 11/1983 | Olsen | 372/45 |
| 4,434,491 | 2/1984 | Sakuma et al. | 372/48 |

OTHER PUBLICATIONS

G. Olsen et al., Journal of Applied Physics, vol. 45, 5112 (1974).

Primary Examiner—James W. Davie
Attorney, Agent, or Firm—Joseph S. Tripoli; Allen LeRoy Limberg; Harley R. Ball

[57] ABSTRACT

Semiconductor devices such as lasers which include a substrate with a channel therein with a clad layer overlying the substrate and filling the channel exhibit irregularities such as terraces in the surface of the clad layer which are detrimental to device performance. These irregularities are substantially eliminated by forming the channel in a surface of a buffer layer greater than about 4 micrometers thick on the substrate and forming the clad layer over the buffer layer and the channel. CW lasers incorporating the principles of the invention exhibit the highest output power in a single spatial mode and maximum output power which have been observed to date.

15 Claims, 10 Drawing Figures

0 μm 2.8 μm 3.6 μm 4.4 μm 4.9 μm 5.6 μm

SEMICONDUCTOR STRUCTURE AND DEVICES

The invention described herein was made in the performance of work under NASA Contract No. NAS 1-17441 and is subject to the provisions of Section 305 of the National Aeronautics and Space Act of 1958 (72 STAT 435; 42 U.S.C. 2457).

The invention relates to a semiconductor structure having a substantially planar surface and to devices such as a semiconductor laser incorporating this structure and to methods of making same.

BACKGROUND OF THE INVENTION

A semiconductor laser typically comprises a substrate, a first clad layer overlying a surface of the substrate, an active region overlying the first clad layer and a second clad layer overlying the active region and a pair of parallel reflecting end faces between which the laser oscillation occurs. This structure provides optical confinement in the transverse direction, the direction perpendicular to the plane of the active region and to the direction of laser oscillation. In the lateral direction, the direction in the plane of the active region and perpendicular to the direction of laser oscillation, it has been found useful to introduce a non-planar structure into the substrate in order to form a refractive index optical waveguide in the lateral direction. The non-planar structure may be a rectangular, dovetail or V-shaped channel in the substrate's surface which extends between the end faces. Laser action then occurs in the active region over the channel with the laterally varying distance between the higher refractive index substrate and the active region providing the refractive index guide. Such structures have been shown to produce moderate output power, on the order of 20 milliwatts, in the fundamental spatial, lateral and transverse, mode.

However, the deposition of the layers over the channel in the substrate results in irregularities such as terraces in the surfaces of these layers which in turn produce kinks in the comparatively thin active layer over the channel. These irregularities produce non-uniformities in the refractive index guide which affect the threshold, the lasing action and the mode structure of the output laser beam, thereby limiting the maximum power attainable from the laser and also the manufacturing yield. Burnham et al. in U.S. Pat. No. 4,317,085 and others have identified these irregularities as arising from differing liquid phase epitaxy growth rates on the different faces of the channel. Burnham et al. disclosed that these irregularities could be reduced or eliminated by depositing the layers over a substrate mesa with the channel therein. This approach, however, requires two separate masking and etching steps, both of which must be carefully controlled to produce the desired result. Thus, it would be desirable to have a structure which substantially eliminated these growth-induced irregularities without the necessity of using the two step etching process.

SUMMARY OF THE INVENTION

We have found that these irregularities in the surface of a layer formed over a surface of a substrate with a channel therein can be substantially eliminated using a semiconductor structure comprising a substrate, a buffer layer greater than about 4 micrometers ($\mu$m) thick overlying a surface of the substrate and having a channel therein and first clad layer which overlies the buffer layer and the channel and has a substantially planar surface. The invention is also a semiconductor laser including an active region and a second clad layer sequentially overlying this semiconductor structure.

The invention also includes a method of forming a semiconductor structure having a substantially planar surface comprising the steps of forming a buffer layer equal to 4 $\mu$m thick on a surface of a substrate, forming a channel only in the buffer layer and forming a first clad layer having a substantially planar surface over the buffer layer and the channel. A method of forming a semiconductor laser of the invention includes the steps of sequentially forming an active region and a second clad region over the substantially planar surface of the semiconductor structure.

DETAILED DESCRIPTION OF PREFERRED EMBODIMENTS

We have discovered that the irregularities in a nominally planar surface of a first clad layer which occur when the layer is formed over a channel in the surface of a substrate can be substantially eliminated by forming a buffer layer greater than about 4 $\mu$m thick on a planar surface of the substrate and then forming the channel only in the buffer layer. The first clad layer and the remaining layers required for a particular device are then sequentially formed over the buffer layer with the channel therein.

A series of wafers were prepared, each of which comprised of N-type GaAs substrate having a planar surface which is a (100) crystallographic plane, an N-type GaAs buffer layer whose thickness varied from wafer to wafer, a plurality of spaced-apart V-shaped channels oriented in the [110] crystallographic direction in a surface of the buffer layer, an N-type AlGaAs first clad layer, an AlGaAs active layer, a P-type AlGaAs second clad layer and a P-type GaAs cap layer.

FIGS. 1–6 are photomicrographs at 70x of portions of these wafers with the labelled buffer layer thicknesses. The bottom portion of each photomicrograph shows a 1° angle-lap cross-section of the particular wafer with the layers over the buffers layer delineated by staining with sodium hypochlorite. The GaAs substrate and the buffer layer with the channels therein appear dark. The AlGaAs first clad layer over the buffer layer is lighter and the AlGaAs active layer appears as the dark line over the first clad layer. Since the buffer layer and substrate are composed of the same material their interface is not seen with the sodium hypochlorite stain. The thicknesses of the buffer layers were measured from 90° cross sections using an A-B stain, as described by G. Olsen et al. in the Journal of Applied Physics 45, 5112 (1974), and are estimated to be accurate to within about ±0.2 $\mu$m.

The dimensions in the vertical direction for the channel depth and the layer thicknesses are magnified by the angle lap. The top portion of each photomicrograph shows a part of the top surface of the wafer with the irregularities parallel to the channels which propagated from the underlying layers to the surface of the cap layer clearly visible.

Figure 1:
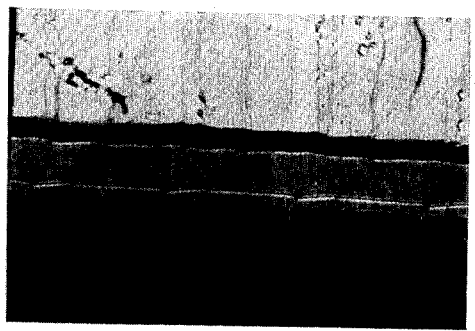
FIGS. 1–6 are photomicrographs of angle lap cross-sections and the top surfaces of wafers having different buffer layer thickness as labelled.
Figure 2:
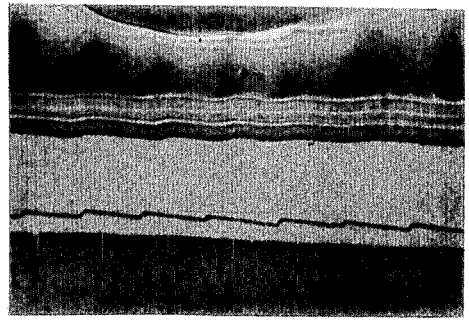
Figure 3:
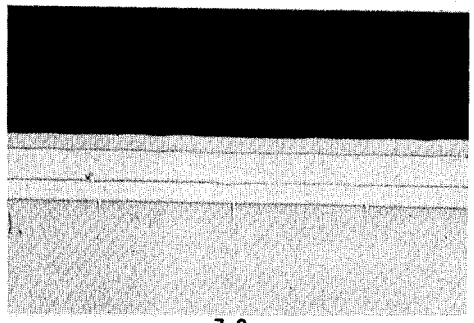
Figure 4:
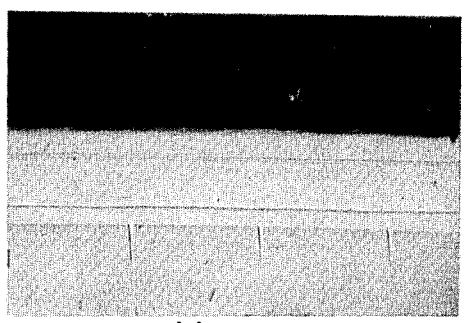
Figure 5:
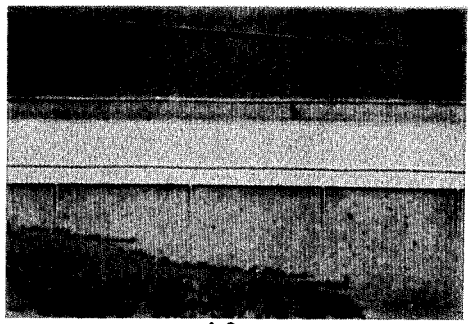
Figure 6:
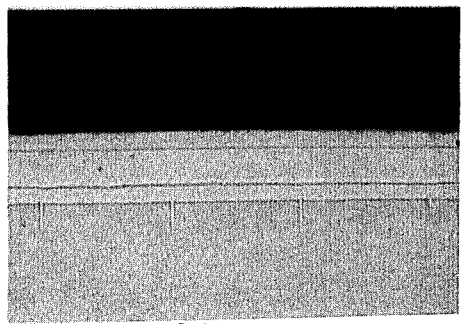

From the photomicrographs it is clear that the irregularities on the otherwise planar surface of the first clad layer decrease with increasing buffer layer thickness and are substantially eliminated for buffer layer thicknesses greater than about 4 μm (FIG. 4).

In FIGS. 7–10 the numbering of the common elements is the same.

Figure 7:
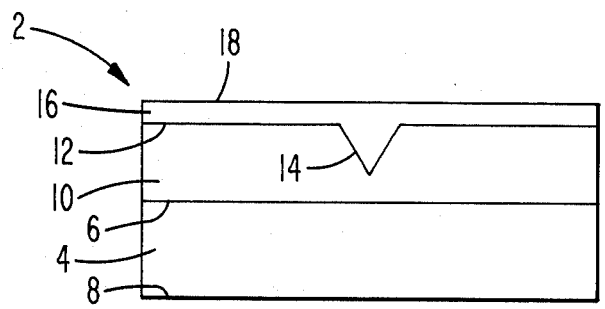
FIG. 7 is a cross-sectional view of a semiconductor structure of the invention.

In FIG. 7 a semiconductor structure 2 comprises a substrate 4 having first and second planar major surfaces 6 and 8, respectively. A buffer layer 10 having a surface 12 overlies the surface 6. A channel 14, shown as V-shaped, extends a distance into the buffer layer 10 from the surface 12. A first clad layer 16 overlies the surface 12, fills the channel 14 and has a substantially planar surface 18.

Figure 8:
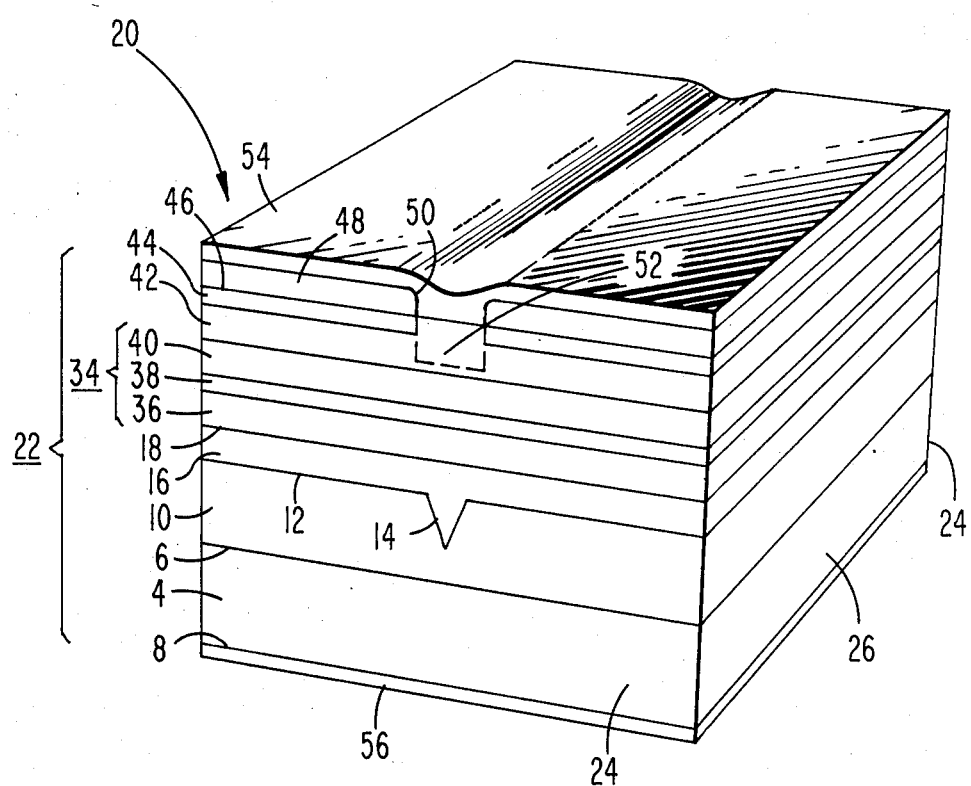
FIG. 8 is a perspective view of a semiconductor laser of the invention.

In FIG. 8 a semiconductor laser 20 includes a semiconductor body 22 having a pair of substantially parallel end faces 24 and a pair of sidewalls 26 extending between the end faces 24. The end faces 24 reflect light at the lasing wavelength to form a laser cavity with at least one of the end faces 24 being partially transparent so that light may be emitted therefrom. The body 22 includes the semiconductor structure 2 as shown in FIGURE 7 with an active region 34 comprising a first guide layer 36 having a substantially planar surface, an active layer 38 having substantially uniform thickness and a second guide layer 40 overlying the surface 18 the first clad layer 16. A second clad layer 42 overlies the active region 34 and a cap layer 44 having a surface 46 overlies the second clad layer 42. An electrically insulating layer 48 overlies the cap layer 44 and has a opening 50 extending therethrough over the channel 14. A high conductivity region 52 extends from a portion of the surface 46 in the vicinity of the opening 50 over the channel 14 through the cap layer 44 and into the second clad layer 42. A first electrical contact 54 overlies the electrically insulating layer 48 and contacts the surface 46 of the cap layer 44 in the opening 50. A second electrical contact 56 provides electrical contact to the second major surface 8 of the substrate 4.

The substrate 4, buffer layer 10, first clad layer 16 and the first guide layer 36 are of one conductivity type and the second guide layer 40, the second clad layer 42 and the cap layer 44 are of the opposite conductivity type. The resistivity of the buffer layer 10 is preferably substantially the same or less than that of the substrate 4. The high conductivity region 52 has the same conductivity type as, but a larger magnitude than, the second clad layer 42 and cap layer 44. The purpose of the region 52 is to restrict the lateral confinement of the electrical current to the region over the channel 14.

The refractive index at the lasing wavelength of the active layer 38 is greater than the refractive indices of the first and second guide layers 38 and 40, respectively. The refractive indices of the guide layers 36 and 40 are greater than those of the adjacent clad layers 16 and 42, respectively. The guide layers 38 and 40 and the clad layers 16 and 42 are preferably substantially transparent at the laser wavelength.

Figure 9:
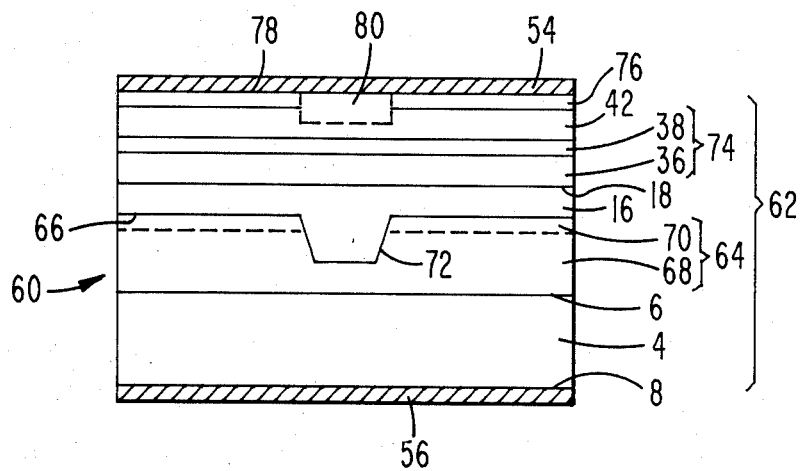
FIG. 9 is a cross-sectional view of a second embodiment of a semiconductor laser of the invention.

In FIG. 9 a laser 60 includes a semiconductor body 62 having a substrate 4 of first conductivity type with a buffer layer 64 having a surface 66 overlying a surface of the substrate. The buffer layer 64 is composed of a first region 68 of first conductivity type and a second region 70 of the opposite conductivity type adjacent to the surface 66. The resistivity of the first region 68 is preferably substantially the same or less than that of the substrate 4. A channel 72, shown as trapezoidal in shape, extends from the surface 66 through the second region 70 and into the first region 68. A first clad layer 16 overlies the buffer layer 64 and the channel 72 and has a substantially planar surface 18. An active region 74 comprising the first guide layer 36 and the active layer 38 overlies the surface 18. A cap layer 76 having a surface 78 overlies the second clad layer 42 and has opposite conductivity type to that of the second clad layer 42. A high conductivity region 80 having the same conductivity type of that of the second clad layer 42 extends through the cap layer 76 and into the second clad layer 42.

In the operation of the laser 60, if the substrate 4 is N-type, a forward bias applied between the electrical contacts 54 and 56 will reverse-bias the P-N junctions at the surface 66 of the buffer layer 64 and at the interface between the second clad layer 42 and the cap layer 76. The electrical current through the body 62 is then constrained to flow into the second clad layer 42 only through the high conductivity region 80 and into the buffer layer 64 only through that portion of the channel 72 extending into the first region 68.

The substrate 4 is typically composed of N-type GaAs having a resistivity between about $10^{-4}$ and $10^{-2}$ ohm-cm. The first major surface of the substrate is typically a (100) plane and is preferably oriented as closely as possible to this plane. The buffer layer 16 preferably contacts the substrate and is composed of N-type GaAs having a resistivity between about $10^{-4}$ and $10^{-2}$ ohm-cm. We have found that the buffer layer must be at least 4 μm thick in order to eliminate the irregularities that form in the overlying layers when they are deposited directly onto a substrate having a channel therein. Typically the buffer layer is greater than 4.5 μm thick and is preferably greater than 5 μm thick. The channel 14 is formed in the buffer layer using standard photolithographic and chemical etching techniques, typically has a width of between about 3 and 5 μm at the surface 26 or 66 and is preferably less than about 7 μm wide at the surface 26 or 66. The channel 14 has a depth of between about 0.8 and 1.5 μm. The shape of the channel, its width and depth in the finished product depend upon the shape, width and depth of the channel prior to the deposition of the overlying layers and the extent of the melt etching at the start of the deposition of the first clad layer 30.

For the laser 60 of FIG. 9 the buffer layer 64 is formed in the same way and has the same thickness and resistivity as the buffer layer 10 of the laser 20. A P-type dopant, typically zinc, is then diffused a distance of between about 0.3 and 0.5 μm into the entire surface 66 to form the second region 70. The channel 72 is then formed using standard techniques.

The first clad layer 16 is less than 1 μm thick and typically between about 0.3 and 0.6 μm thick over the surface 12 or 66 and is composed of an N-type $Al_vGa_{1-v}As$ where v is between about 0.25 and 0.4. The first and second guide layers 36 and 40 are typically between about 0.2 and 0.4 μm thick and are composed of N and P type $Al_wGa_{1-w}As$, respectively, where w is between about 0.15 and 0.25. The active layer 38 is between about 0.08 and 0.12 μm thick and is composed of $Al_xGa_{1-x}As$ where x is between about 0.0 and 0.07. It is to be understood that the guide layers are not necessary for the operation of useful laser devices. The active region may consist simply of the active layers 38 on the first clad layer 30. The second clad layer 42 is about 1.5 μm thick and is composed of $Al_yGa_{1-y}As$ where y is between about 0.25 and 0.4. The cap layer 44 of laser 20 is composed of P type GaAs about 0.7 μm thick. The cap layer 76 of laser 60 is composed of N-type GaAs. The high conductivity regions 52 and 80 contain an excess concentration of P-type conductivity modifiers of between about 1 and $5 \times 10^{19}/cm^3$.

The electrically insulating layer 48 is typically composed of a silicon oxide formed by pyrolitic decomposition of silane in an oxygen atmosphere. The opening 50 is then formed using standard photolithographic and etching techniques. The first electrical contact 54 is typically composed of layers of titanium, platinum and gold sequentially deposited by vacuum evaporation followed by a sintering step. The second electrical contact 56 is typically composed of layers of gold, germanium, nickel and gold sequentially deposited by evaporation followed by a sintering step. The combination of these electrical contacts together with a means of constraining the electrical current distribution in the lateral direction are the means for providing electrical connections to the semiconductor body.

A batch of semiconductor lasers are fabricated according to the principles of the invention and having the structure shown in FIG. 8 with a 4.9 μm thick buffer layer, a 0.1 μm thick active layer, a 6 μm wide and 1.3 μm deep V-shaped channel and without the guide layers. Lasers from this batch had a CW output power of about 100 milliwatts in a single spatial mode with less than 10% of the power in spectral sidebands, a CW output power greater than about 150 milliwatts in a single spatial mode and a maximum CW output power of 190 milliwatts. The combination of these output powers and mode characteristics are significantly greater than any previously reported for a semiconductor laser.

Figure 10:
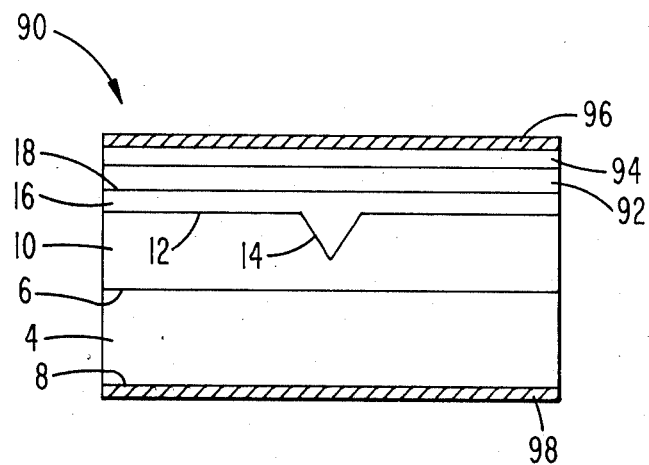
FIG. 10 is a cross-sectional view of an optical waveguide structure of the invention.
Figure 1:
Figure 2:
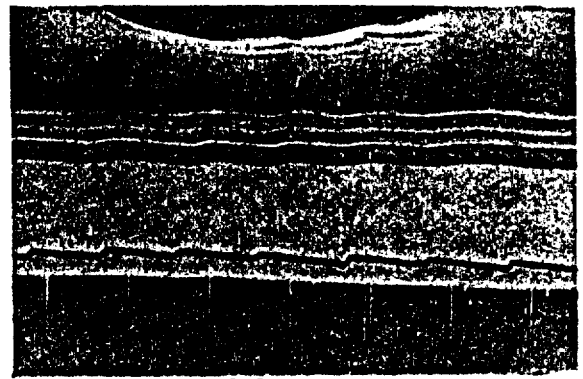
Figure 3:
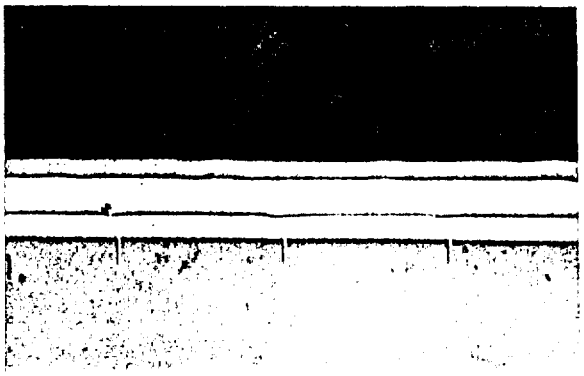
Figure 4:
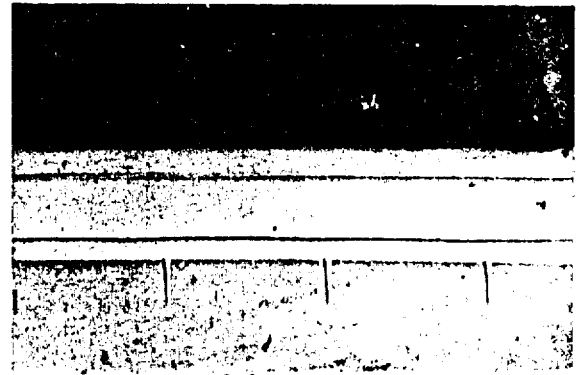
Figure 5:
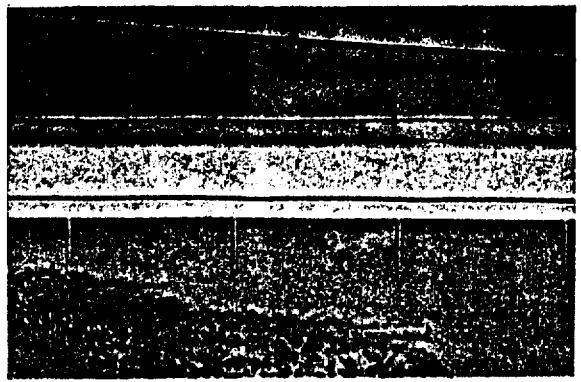
Figure 6:
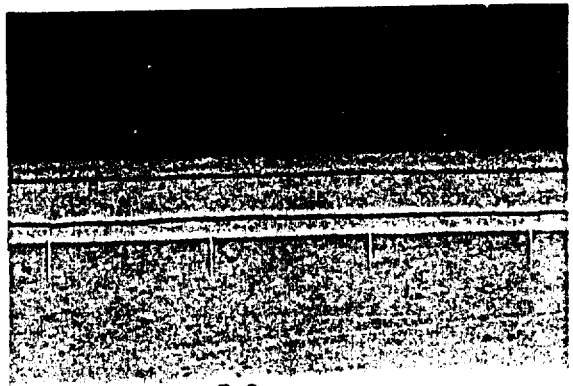

The semiconductor structure 2 of FIG. 7 is also useful in other devices such as an optical waveguide 90, shown in FIG. 10, which includes waveguide layer 92 overlying the substantially planar surface 18 of the first clad layer 16 and a cover layer 94 overlying the waveguide layer 92. A first electrical contact 96 to the cover layer 94 and a second electrical contact 98 to the substrate 4 provide means for electrically altering the optical properties of the waveguide layer 92.

The waveguide layer 92 in which light propagates has a higher refractive index than the contiguous layers and preferably has substantially intrinsic conductivity type. The waveguide layer 92 and the contiguous layers are preferably substantially transparent.

While the structure and devices of the invention have been described as composed of GaAs and AlGaAs alloys, it is to be understood that other combinations of Group III–V alloys can be used. The layers are deposited using standard liquid phase epitaxy techniques such as those disclosed by Lockwood et al. in U.S. Pat. No. 3,753,801, incorporated herein by reference. The buffer layer is preferably formed on the substrate by liquid phase epitaxy, the channel is formed in the buffer layer and the remainder of the layers are then sequentially formed over the buffer layer. Preferably the substrate and buffer layer are composed of the same Group III–V alloy.

We claim:

1. A semiconductor structure comprising a substrate having first and second opposed major surfaces;
   a buffer layer having a thickness greater than about 4 micrometers thick overlying the first major surface and having a surface with a channel therein, said channel having a depth less than the buffer layer thickness; and
   a first clad layer overlying the buffer layer and the channel and having a substantially planar surface;
   said substrate and said buffer layer being of one conductivity type with the resistivity of the buffer layer being substantially the same or less than the resistivity of the substrate.

2. The structure of claim 1 wherein the substrate and buffer layer are composed of the same Group III–V alloy.

3. The structure of claim 2 wherein the width of the channel at the surface of the buffer layer is less than about 7 micrometers.

4. The structure of claim 3 wherein the buffer layer is greater than about 4.5 micrometers thick.

5. The structure of claim 4 wherein the buffer layer is greater than about 5 micrometers thick.

6. The structure of claim 1 further comprising:
   an active region overlying the first clad layer; and
   a second clad layer overlying the active region and having the opposite conductivity type to that of the substrate;
   said substrate, buffer layer, first and second clad layers and said active region forming a body of semiconductor material, said body having a pair of reflective end faces, at least one of which is partially transparent at a particular wavelength of light and said channel extending between said end faces.

7. The structure of claim 1 further comprising a waveguide layer overlying the first clad layer.

8. A semiconductor laser for operation at a particular wavelength comprising:
   a body of semiconductor material having first and second reflective end faces, at least one of which is partially transparent so that light of said wavelength may be transmitted therethrough, said body comprising
   a substrate having first and second opposed major surfaces;
   a buffer layer having a thickness greater than about 4 micrometers overlying the first major surface and having a surface with a channel therein, said channel extending between said end faces and having a depth which is less than the buffer layer thickness;
   a first clad layer overlying the buffer layer and the channel;
   an active region overlying the first clad layer;
   a second clad layer overlying the active region; and
   means for providing electrical connections to said body;
   said substrate, buffer and first clad layers being of first conductivity type, the second clad layer being of the opposite conductivity type and the resistivity of the buffer layer being substantially the same as or less than the resistivity of the substrate.

9. The laser of claim 8 wherein the substrate and the buffer layer are composed of the same Group III–V alloy.

10. The laser of claim 9 wherein the width of the channel at the surface of the buffer layer is less than about 7 micrometers.

11. The laser of claim 10 wherein the buffer layer is greater than about 4.5 micrometers thick.

12. The laser of claim 11 wherein the buffer layer is greater than about 5 micrometers thick.

13. The laser of claim 8 wherein the active region comprises an active layer and an adjacent guide layer.

14. The laser of claim 13 wherein the guide layer overlies the first clad layer and the active layer overlies the guide layer.

15. The laser of claim 8 further comprising a region of opposite conductivity type extending a distance into the buffer layer from said surface thereof with the channel extending through said region into the portion of the buffer layer of first conductivity type.

* * * * *

UNITED STATES PATENT AND TRADEMARK OFFICE
CERTIFICATE OF CORRECTION

PATENT NO. : 4,691,320

DATED : September 1, 1987

INVENTOR(S) : Nancy A. Dinkel et al.

It is certified that error appears in the above-identified patent and that said Letters Patent is hereby corrected as shown below:

Delete Sheet 1 of the Drawing and substitute the attached Sheet 1 containing FIGS. 1-6.

Signed and Sealed this

Nineteenth Day of July, 1988

Attest:

DONALD J. QUIGG

*Attesting Officer*  *Commissioner of Patents and Trademarks*

0 μm 2.8 μm 3.6 μm 4.4 μm 4.9 μm 5.6 μm